United States Patent
Hwang

[19]

[11] Patent Number: 5,969,540
[45] Date of Patent: Oct. 19, 1999

[54] THREE-LEVEL DETECTOR WITHOUT STANDBY CURRENT

[75] Inventor: Yung-Peng Hwang, Taipei, Taiwan

[73] Assignee: Winbond Electronics Corp., Hsinchu, Taiwan

[21] Appl. No.: 09/020,078

[22] Filed: Feb. 6, 1998

[30] Foreign Application Priority Data

Oct. 28, 1997 [TW] Taiwan ................................. 86116000

[51] Int. Cl.$^6$ .................................................. H03K 19/00
[52] U.S. Cl. .................................. 326/56; 326/59; 326/31
[58] Field of Search .................................. 326/56, 57, 59, 326/60, 26, 27, 52, 54, 22, 23, 24, 31, 93, 95

[56] References Cited

U.S. PATENT DOCUMENTS 5,602,493  2/1997  Konishi et al. ............................ 326/33

Primary Examiner—Michael Tokar
Assistant Examiner—Anh Q Tran
Attorney, Agent, or Firm—Ladas & Parry

[57] ABSTRACT

A three-level detector is used to detect the state of a level input pertaining to a relatively-high level, a relatively-low level, or floating. The three-level detector comprises a first inverter, a second inverter, a decision logic circuit, a switching circuit, and a latch. The first inverter and the second inverter, whose inputs are connected to the level input, have a relatively-high threshold voltage and a relatively-low threshold voltage, respectively. The decision logic circuit generates a detected signal representing the state of the level input in response to outputs of the first and second inverters. Moreover, the switching circuit is connected between the level input and a reference level. The latch generates one control signal to regulate the state of the switching circuit. When the state of the level input pertains to either the relatively-high level or a relatively-low level, the switching circuit is turned off. The switching circuit is turned on when the state of the level input is floating.

11 Claims, 2 Drawing Sheets

5,969,540

THREE-LEVEL DETECTOR WITHOUT STANDBY CURRENT

BACKGROUND OF THE INVENTION

1. Field of the Invention

The present invention generally relates to level detection technologies. In particular, the present invention relates to a three-level detector for differentiating the state of an input level pertaining to high level, low level, or floating but having no standby current.

2. Description of the Prior Art

Generally speaking, in the design of semiconductor integrated circuits some pins may be reserved testing or mode control applications. Some of those reserved pins are utilized to control test modes. While product costs are taken into account, three-level detectors are generally provided to differentiate the state of high level, low level, or floating at the reserved pins. Therefore, the number of the reserved pins provided for controlling test modes can be fewer than that of the desired test modes.

Referring to FIG. 1, the circuit diagram of a conventional three-level detector is schematically illustrated. Resistors R1 and R2 are connected between a power level $V_{DD}$ and a ground level GND in series. In the drawing, the node between the resistors R1 and R2 is designated as a node voltage V1. A level input 1 is used to receive a level signal, and electrically connected to the node between the resistors R1 and R1. Accordingly, the node voltage V1 is determined by the level signal, the power level $V_{DD}$ and the ground level GND as well.

Usually, the resistance of the resistor R1 is approximately equal to that of the resistor R2; therefore the node voltage V1 is half of the power level $V_{DD}$ when the level input 1 is floating. However, because of the limitation of the driving capacity as to the level input 1, the resistance of the resistors R1 and R2 should be cautiously chosen. If the resistance is too large, the circuit will be susceptible to noise interference. To the contrary, power consumption will be the problem while the chosen resistance is too small. Therefore, the resistance of the resistors R1 and R2 may range from about 10K to about 100K, preferably.

In FIG. 1, a pair of inverters N1 and N2 is provided to being configured with respective inputs connected to the node voltage V1, both outputs of which are connected to a decision logic circuit 10. Then, a detected result 2 is outputted by the decision logic circuit 10. Note that the threshold voltages of the inverters N1 and N2 are adjusted to be relatively-high and relatively-low, respectively. For instance, the inverter N1 has a threshold voltage between a level slightly lower than a high level voltage (e.g., the power level $V_{DD}$) and half of the power level $V_{DD}$. The inverter N2 has a threshold voltage between a level slightly higher than a low level voltage (e.g., the ground level GND) and half of the power level $V_{DD}$. A detected result 2 standing for the state of the level input 1 is generated by the decision logic circuit 10. For example, the detected result 2 is comprised of two bits while three levels such as high, low, and floating are used to differentiation.

The operation of the level detector as shown in FIG. 1 will be described in the following. When a high level (e.g., 5V) is applied to the level input 1, the node voltage V1 will be powered to the same voltage as the high level. The node voltage V1 applies such a high level to the inputs of the inverters N1 and N2. Because the high level is greater than the relatively-high and relatively-low threshold voltages, both inverters N1 and N2 transmit low levels to the decision logic circuit 10, which generates the detected result 2 which indicates that the state of the level input 1 is high level. To the contrary, when a low level (e.g., 0V) is applied to the level input 1, the node voltage V1 will be powered to the same voltage as the low level. Therefore, the node voltage V1 applies such a low level to the inputs of the inverters N1 and N2. Because the low level is smaller than the relatively-high and relatively-low threshold voltages, both inverters N1 and N2 transmit high levels to the decision logic circuit 10, which generates the detected result 2 which indicates that the state of the level input 1 is low level. Moreover, if the level input 1 is floating, the node voltage V1 will be half of the power level $V_{DD}$, and applied to the inputs of the inverters N1 and N2. Under these circumstances, inverters N1 and N2 transmit respectively a low level and a high level to the decision logic circuit 10, because the node voltage V1 is greater than the relatively-low threshold voltage but smaller than the relatively-high voltage. The detected result 2 indicating that the level input 1 is floating is thereafter generated by the decision logic circuit 10.

For decreasing the layout area required for the level detector, those resistors can be replaced by active devices. Referring to FIG. 2, the circuit diagram of another conventional level detector is schematically illustrated. In the drawing, two metal-oxide-semiconductor field-effect transistors (MOSFETs) M1 and M2 substitute for the resistors R1 and R2 as shown in FIG. 1, respectively. The P-type MOSFET M1 is configured with both its gate and drain tied to the node voltage V1, and its source connected to the power level $V_{DD}$. However, the N-type MOSFET M2 is configured with both its gate and drain tied to the node voltage V1, and its source connected to the ground level GND.

In line with the trend of pursuing low power and portability, the quantity of power dissipated by each device within electronic products should be carefully taken into account. Nevertheless, there is a current flowing through the aforementioned level detectors no matter whether the state of the level input pertains to high level, low level, or floating. For the foregoing reason, there is a need for a level detector that can differentiate between input levels where the possible levels are high, low, or floating but having no standby current.

SUMMARY OF THE INVENTION

It is an object of the present invention to provide an three-level detector that can differentiate between input levels where the possible levels are high, low, or floating but having no standby current so as to decrease power dissipation thereof.

Another object of the present invention is to provide a three-level detector that is both less susceptible to noise interference and possessing greater immunity to noise.

The present invention achieves the above-indicated objects by providing A three-level detector for detecting the state of a level input where the relevant levels provided are relatively-high, relatively-low, and floating. The three-level detector comprises a first inverter, a second inverter, a decision logic circuit, a switching circuit, and a latch. The first inverter and the second inverter, whose inputs are connected to the level input, have a relatively-high threshold voltage and a relatively-low threshold voltage, respectively. The decision logic circuit generates a detected signal representing the state of the level input in response to the outputs of the first and second inverters. Moreover, the switching circuit is connected between the level input and a reference level. The latch generates one control signal to regulate the state of the switching circuit. When the state of the level input pertains to either a relatively-high level or a relatively-low level, the switching circuit is turned off. The switching circuit is turned on when the state of the level input is floating.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
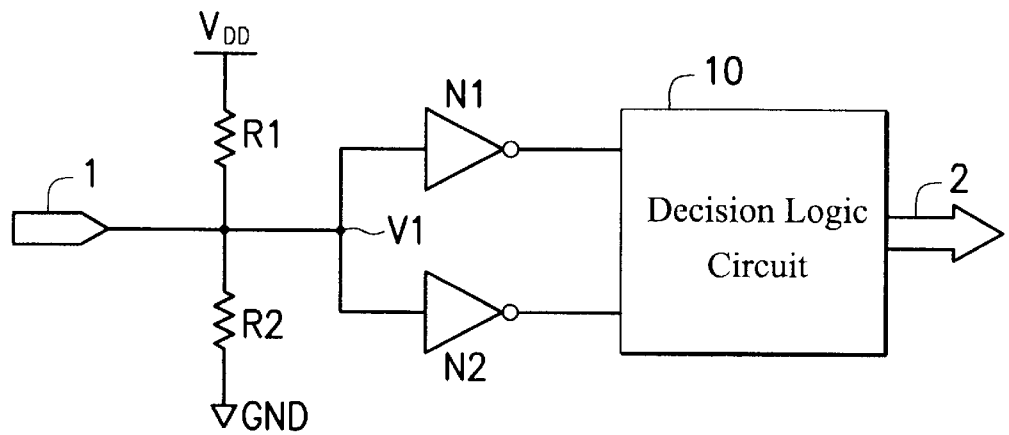
FIG. 1 schematically depicts the circuit diagram of one conventional level detector.
Figure 2:
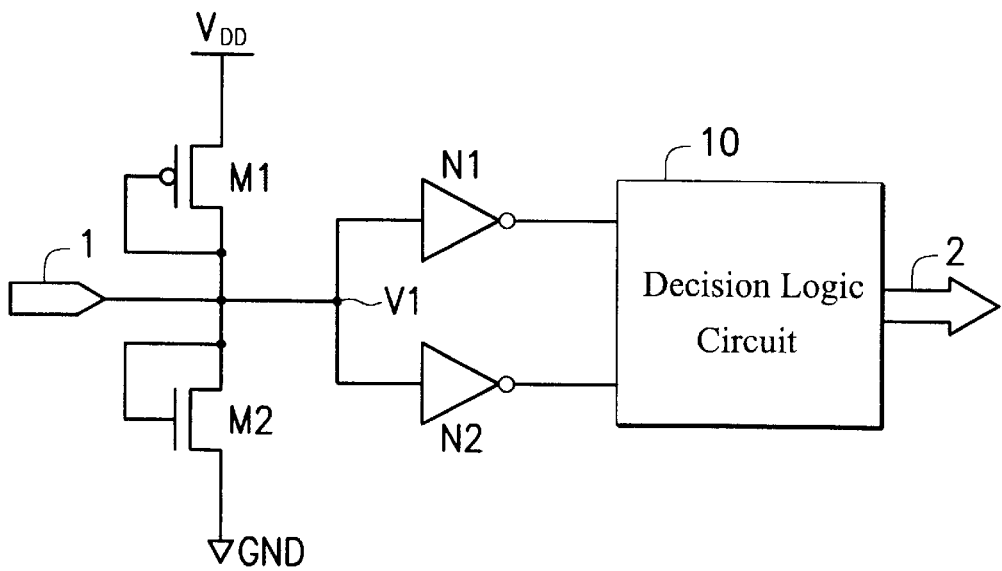
FIG. 2 schematically depicts the circuit diagram of another conventional level detector.
Figure 3:
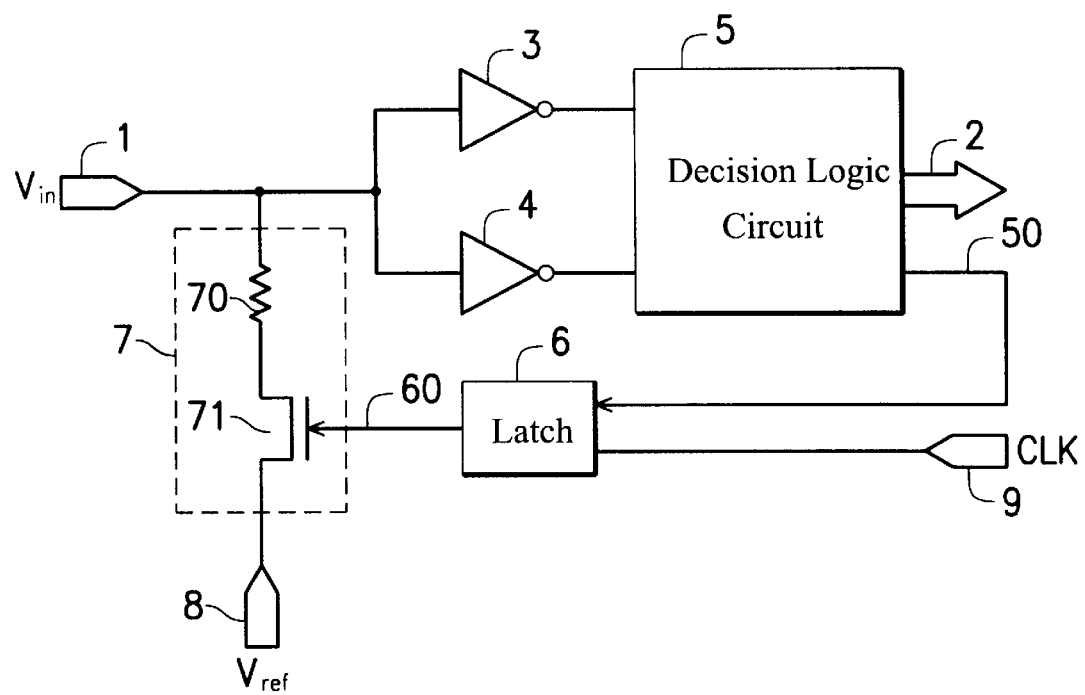
FIG. 3 schematically depicts the circuit diagram of one preferred embodiment in accordance with the present invention.

According to the present invention, a three-level detector is positioned at one pin of an integrated circuit reserved for testing in order to detect the state of high level VH, low level VL, or floating, which represents different test modes, respectively. Referring to FIG. 3, the circuit diagram of one preferred embodiment in accordance with the present invention is schematically illustrated. The three-level detector in accordance with the present invention comprises a first inverter 3, a second inverter 4, a decision logic circuit 5, a latch 6, and a switching circuit 7.

The outputs of the first inverter 3 and the second inverter 4 are connected to the level input 1 to receive a level input signal Vin, and the outputs of the first inverter 3 and the second inverter 4 are connected to the decision logic circuit 5, respectively. The decision logic circuit 5 generates a detected signal 2 according to the outputs of the inverters 3 and 4. The first inverter 3 and the second inverter 4 are adjusted to have a relatively-high threshold voltage VT1 and a relatively-low threshold voltage VT2, respectively. Preferably, the first inverter 3 has a threshold voltage VT1 between slightly lower than the high level voltage VH and its half, VH/2. The second inverter 4 has a threshold voltage VT2 slightly higher than the low level voltage VL and half of the high level voltage, VH/2. The detected signal 2 generated by the decision logic circuit 10 stands for the state of the level input 1 is. For example, the detected result 2 is comprised of two bits while three levels such as high, low, and floating are used to provide differentiation.

Furthermore, in response to the outputs of the first inverter 3 and the second inverter 4 the decision logic A circuit 5 generates a first control signal 50. The latch 6 receives the first control signal 50 and a clock signal CLK as well, and transmits a second control signal 60 to the switching circuit 7. The ON/OFF state of the switching circuit 7, which is connected between the level input 1 and a reference node 8, is determined by the second control signal 60. The reference node 8 provides a reference level Vref. When the level input 1 is floating or initially power-on, the second control signal 60 turns on the switching circuit 7 so that the reference level Vref at the node 8 can be applied to the inputs of the first inverter 3 and the second inverter 4. To the contrary, the second control signal 60 turns off the switching circuit 7 so as to leave the connection between the level input 1 and the reference node 8 open while the level input 1 pertains to either high level or low level.

Due to the fact that most integrated circuits may be provided with a clock signal CLK and a reference level Vref (In particular, the reference level Vref, virtually VH/2, must be provided in the application of analog ICs), no extra clock signal and reference level are required.

As shown in FIG. 3, the switching circuit 7 comprises a resistor 70 and a N-type MOSFET device 71. The resistor 70 is connected to the level input 1 and one source/drain of the N-type MOSFET device 71. The N-type MOSFET device 71 has a gate controlled by the second control signal 60, and another source/drain connected to the reference node 8. The use of the N-type MOSFET device 71 to constitute the switching circuit 7 is one example of several implements, but does not limit the scope of the present invention.

The operation of the circuit depicted in FIG. 3 will be described as follows. First of all, the high level VH exemplifies 5V, and the low level VL exemplifies 0V. Accordingly, the reference level Vref applied to the reference node 8 may range from about 1.5V to about 3.5V. Since the threshold voltage VT1 of the first inverter 3 is within the range of VH~VH/2, VT1 has an electric potential of about 2.5~4.5V. However, because the threshold voltage VT2 of the second inverter 4 is within the range of VL~VH/2, VT2 has an electric potential of about 0.5~2.5V. In summary, the high level VH is greater than the relatively-high threshold voltage VT1, the relatively-high threshold voltage VT1 greater than the reference level Vref, the reference level Vref greater than the relatively-low threshold voltage VT2, and the relatively-low threshold voltage VT2 greater than the low level VL. The relationship of VH>VT1>Vref>VT2>VL can be expressed in simple terms.

When the level input signal Vin at the level input 1 pertains to the high level VH, both outputs of the first inverter 3 and the second inverter 4 are low level VL because VH is greater than the threshold voltages VT1 and VT2. Then, two low levels outputted from the first and second inverters 3 and 4 reach the decision logic circuit 5 to form the detected signal 2, which indicates that the present state of the level input signal Vin is high level VH. In addition, the decision logic circuit 5 generates the first control signal 50 to be low level VL in response to the low levels outputted from the first and second inverter 3 and 4.

Moreover, when the level input signal Vin at the level input 1 pertains to low level VL, both outputs of the first is inverter 3 and the second inverter 4 are high level VH because VL is smaller than the threshold voltages VT1 and VT2. Then, two high levels outputted from the first and second inverters 3 and 4 reach the decision logic circuit 5 to form the detected signal 2, which indicates that the present state of the level input signal Vin is low level VL. In addition, the decision logic circuit 5 generates the first control signal 50 to be the low level VL in response to the high levels outputted from the first and second inverter 3 and 4.

On account of the fact that the first control signal 50 becomes low level when the level input signal pertains to either the high level VH or low level VL, a exclusive-OR gate can be utilized for implementation in the decision logic circuit 5. Accordingly, the outputs of the first and second inverters 3 and 4 serve for the inputs of the exclusive-OR gate, the output of which acts as the first control signal 50. The first control signal 50 provides the low level VL to the latch 6, which makes the second control signal 60 become low level VL so as to turn off the N-type MOSFET device 71 through its gate. Generally speaking, the switching circuit 7 is turned off so that the connection between the reference node 8 and the level input 1 is left open and disconnected.

When the level input 1 is floating or initially power-on, the outputs of the first inverter 3 and the second inverter 4 become the low level VL and the high level VH, respectively, transmitted to the decision logic circuit 5. The decision logic circuit 5 processes the outputs of the first and second inverters 3 and 4, and generates the detected signal 2, which indicates that the present state of the level input signal Vin is floating. In addition, the decision logic circuit 5 generates the first control signal 50 to be high level VH in response to the different logic levels outputted from the first and second inverter 3 and 4. As mentioned above, the exclusive-OR gate can be utilized for implementation in the decision logic circuit 5. Accordingly, the outputs of the first and second inverters 3 and 4 serve for the inputs of the exclusive-OR gate, the output of which acts as the first control signal 50. In these circumstance, the first control signal 50 provides the high level VH to the latch 6, which in conjunction with the accompanying clock signal CLK makes the second control signal 60 become high level VH so as to turn on the N-type MOSFET device 71 through its gate. Generally speaking, the switching circuit 7 is turned on so that the reference level Vref at the reference node 8 can be applied to both inputs of the first inverter 3 and the second inverter 4.

In conclusion, when the level input signal Vin pertains to either high level VH or low level VL, the latch 6 turns off the switching circuit 7 to disconnect the conducting path between the level input 1 and the reference node 8 so that no standby current occurs. When the level input 1 is floating or initially power-on, the latch 6 turns on the switching circuit 7 so that the inputs of the first inverter 3 and the second inverter 4 are driven by the reference level Vref. At that time, the inputs of the first inverter 3 and the second inverter 4 are low impedance nodes, which are less susceptible to noise interference as well as being greatly immune to noise.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, to practice various other embodiments, and to make various modifications suited to the particular use contemplated. It is intended that the scope of the invention be defined by the following claims and their equivalents.

What is claimed is:

1. A three-level detector for differentiating the state of a level input pertaining to one of a relatively-high level, a relatively-low level, and floating, said three-level detector comprising:
    a first inverter and a second inverter, whose inputs are connected to said level input, having a relatively-high threshold voltage and a relatively-low threshold voltage, respectively;
    a decision logic circuit generating a detected signal, which represents the state of said level input, in response to outputs of said first and second inverters;
    a switching circuit connected between said level input and a reference level; and
    a latch generating one control signal to regulate the state of said switching circuit, wherein said switching circuit is turned off when the state of said level input pertains to one of said relatively-high level and said relatively-low level, and turned on when the state of said level input is floating.

2. The three-level detector as claimed in claim 1, wherein said switching circuit comprises:
    a transistor having a gate controlled by said one control signal, one source/drain connected to said reference level; and
    a resistor connected between said level input and another source/drain of said transistor.

3. The three-level detector as claimed in claim 1, wherein said decision logic circuit transmits another control signal to said latch in response to said outputs of said first and second inverters.

4. The three-level detector as claimed in claim 3, further comprising a clock signal enabling said latch.

5. The three-level detector as claimed in claim 4, wherein said latch generates said one control signal to regulate said switching circuit in response to said another control signal and said clock signal.

6. The three-level detector as claimed in claim 1, wherein said relatively-high level is greater than said relatively-high threshold voltage, said relatively-high threshold voltage greater than said reference level, said reference level greater than said relatively-low threshold voltage, and said relatively-low threshold voltage greater than said relatively-low level.

7. A three-level detector for detecting the state of a level input pertaining to one of a relatively-high level, a relatively-low level, and floating, said three-level detector comprising:
    a first inverter and a second inverter, whose inputs are connected to said level input, having a relatively-high threshold voltage and a relatively-low threshold voltage, respectively;
    a decision logic circuit generating a detected signal, which represents the state of said level input, in response to outputs of said first and second inverters;
    a transistor having one source/drain connected to a reference level;
    a resistor connected between said level input and another source/drain; and
    a latch transmitting one control signal to a gate of said transistor, wherein said transistor is turned off when the state of said level input pertains to one of said relatively-high level and said relatively-low level, and turned on when the state of said level input pertains to said floating.

8. The three-level detector as claimed in claim 7, wherein said decision logic circuit transmits another control signal to said latch in response to said outputs of said first and second inverters.

9. The three-level detector as claimed in claim 8, further comprising a clock signal enabling said latch.

10. The three-level detector as claimed in claim 9, wherein said latch generates said one control signal to said gate of said transistor in response to said another control signal and said clock signal.

11. The three-level detector as claimed in claim 7, wherein said relatively-high level is greater than said relatively-high threshold voltage, said relatively-high threshold voltage greater than said reference level, said reference level greater than said relatively-low threshold voltage, and said relatively-low threshold voltage greater than said relatively-low level.

* * * * *